United States Patent
Andy et al.

(10) Patent No.: US 10,642,077 B1
(45) Date of Patent: May 5, 2020

(54) LATERAL MOSCAP PHASE ADJUSTER

(71) Applicant: Elenion Technologies, LLC, New York, NY (US)

(72) Inventors: Lim Eu-Jin Andy, Singapore (SG); Yangjin Ma, Brooklyn, NY (US); Alexandre Horth, Astoria, NY (US); Yang Liu, Elmhurst, NY (US)

(73) Assignee: Elenion Technologies, LLC, New York, NY (US)

( * ) Notice: Subject to any disclaimer, the term of this patent is extended or adjusted under 35 U.S.C. 154(b) by 0 days.

(21) Appl. No.: 16/196,947

(22) Filed: Nov. 20, 2018

(51) Int. Cl.
*G02F 1/035* (2006.01)
*G02F 1/025* (2006.01)
*H01L 29/94* (2006.01)
*H01L 29/66* (2006.01)
*H01L 21/308* (2006.01)
*H01L 21/22* (2006.01)

(52) U.S. Cl.
CPC ........ *G02F 1/025* (2013.01); *H01L 29/66189* (2013.01); *H01L 29/94* (2013.01); *G02F 2202/104* (2013.01); *G02F 2202/105* (2013.01); *G02F 2203/50* (2013.01); *H01L 21/22* (2013.01); *H01L 21/308* (2013.01)

(58) Field of Classification Search
CPC ............... G02F 1/025; G02F 2202/104; G02F 2202/105; G02F 2203/50; H01L 29/66189; H01L 29/94; H01L 21/22; H01L 21/308
See application file for complete search history.

(56) References Cited

U.S. PATENT DOCUMENTS

| | | | | |
|---|---|---|---|---|
| 6,191,463 B1* | 2/2001 | Mitani | ............. | H01L 21/28176 257/411 |
| 6,455,875 B2* | 9/2002 | Takemura | ............... | H01L 27/12 257/72 |
| 7,657,130 B2 | 2/2010 | Shastri et al. | .................... | 385/2 |
| 8,362,494 B2 | 1/2013 | Lo et al. | ......................... | 257/79 |
| 8,737,772 B2* | 5/2014 | Dong | ..................... | G02F 1/025 385/2 |
| 9,310,629 B2 | 4/2016 | Patel et al. | ............. | G02F 1/011 |
| 9,684,194 B2* | 6/2017 | Gardes | .................... | G02F 1/025 |
| 9,891,450 B2* | 2/2018 | Baudot | ................... | G02F 1/025 |
| 10,191,350 B2* | 1/2019 | Yu | ........................... | G02F 1/025 |
| 2010/0060970 A1* | 3/2010 | Chen | ...................... | G02F 1/025 359/245 |
| 2010/0080504 A1* | 4/2010 | Shetrit | ............... | G02B 6/12004 385/14 |
| 2011/0180795 A1* | 7/2011 | Lo | ........................... | G02F 1/025 257/51 |

(Continued)

*Primary Examiner* — Ellen E Kim
(74) *Attorney, Agent, or Firm* — Stratford Managers Corporation

(57) ABSTRACT

A MOSCAP phase adjuster includes two conductive regions with a thin insulating region therebetween, where charge is accumulated or depleted. In conventional MOSCAP modulators, the conductive and insulating regions are superposed layers, extending horizontally parallel to the substrate, which limits waveguide design and mode confinement, resulting in reduced phase shift performance. An improved MOSCAP phase adjuster and method of fabricating a MOSCAP phase adjuster includes depositing the material for the second conductive region beside and over top of the first conductive region after oxidation, and selectively etching the material to form the second conductive region.

9 Claims, 10 Drawing Sheets

(56) References Cited

U.S. PATENT DOCUMENTS

2014/0127842 A1* 5/2014 Song ................. G02F 1/025
                                                    438/31
2018/0046057 A1* 2/2018 Yu .................... G02F 1/025

* cited by examiner

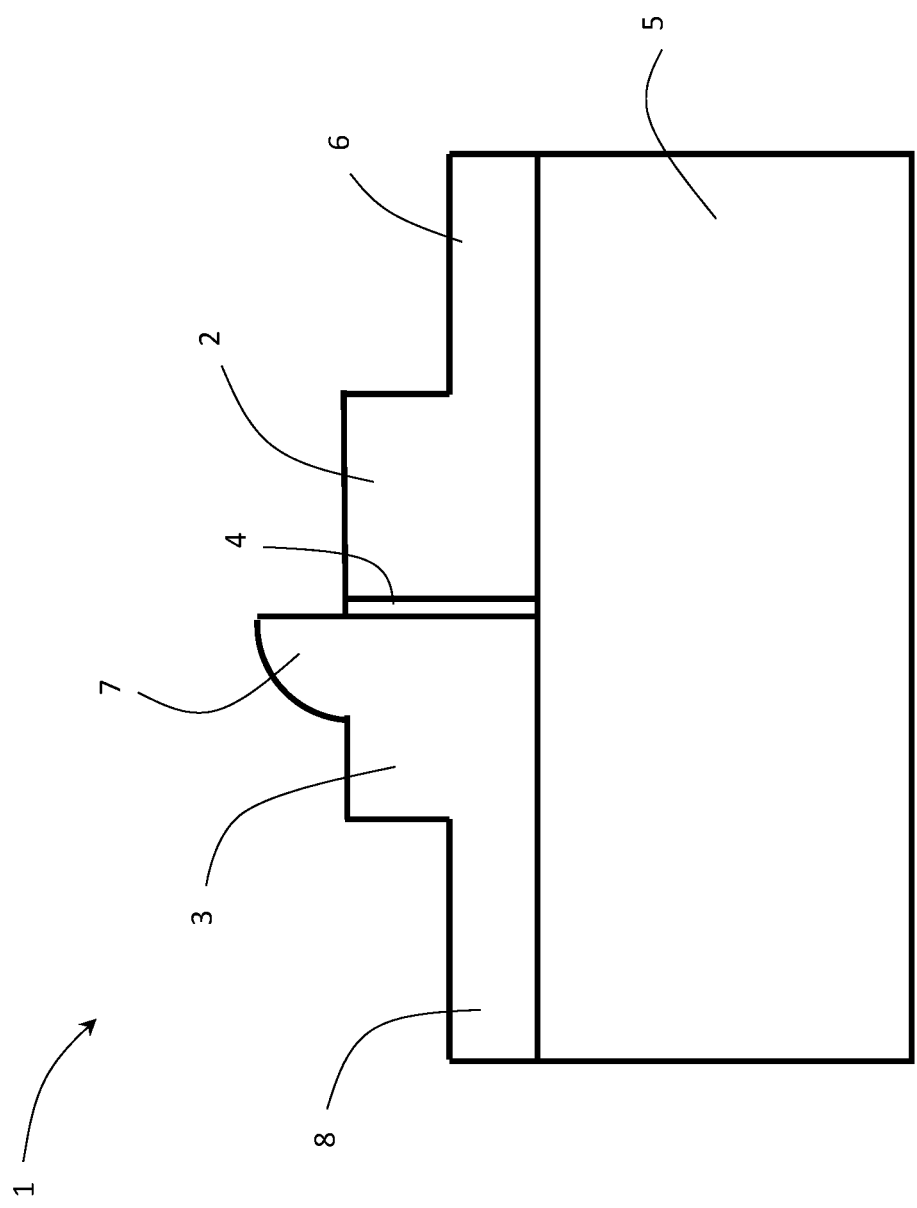

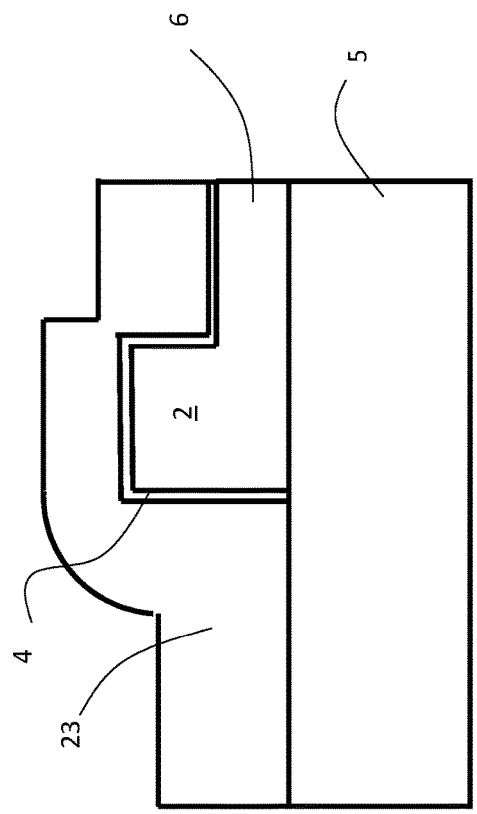
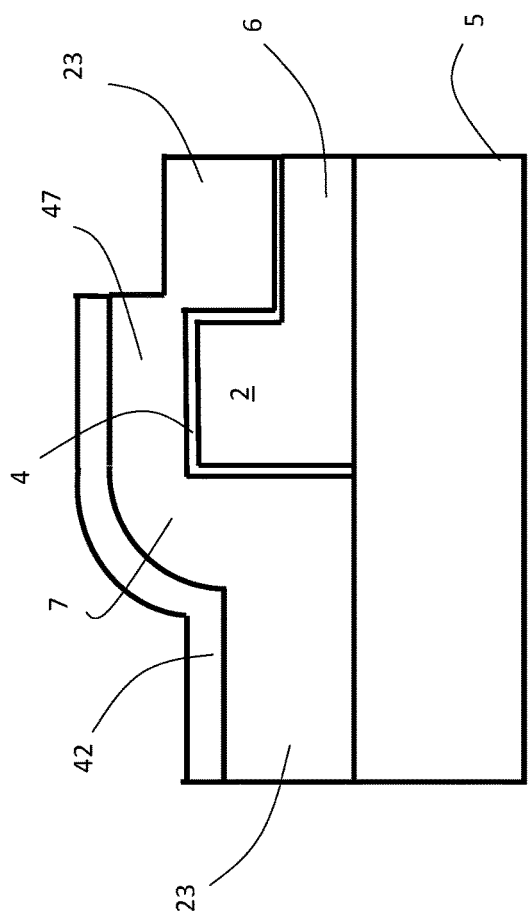

US 10,642,077 B1

LATERAL MOSCAP PHASE ADJUSTER

TECHNICAL FIELD

The present invention relates to a phase adjuster, and in particular to a lateral metal-oxide-semiconductor capacitor (MOSCAP) structure for use as a phase adjuster in optical devices, such as modulators.

BACKGROUND

In a MOSCAP, e.g. silicon-insulator-silicon capacitor (SISCAP), phase adjuster, charge is accumulated or depleted at the interface of a thin insulating region between two conductive regions. The metal conductive region is typically a p+ or n+ doped poly-silicon region, that behaves like a metal. The change in effective index of the waveguide material is driven by a modulation of the carrier density in an electrically active waveguide. In SISCAP Mach-Zehnder modulators, comprising a pair of waveguide arms, a MOSCAP phase adjuster causes changes to the effective index of the waveguide material resulting in a differential change in phase of the light propagating in the arms, which can be used to modulate an optical signal.

In conventional SISCAP modulators, such as the one disclosed in U.S. Pat. No. 7,657,130, issued Feb. 2, 2010, to Shastri et al, the conductive and insulating regions are superposed layers, extending horizontally parallel to the substrate. Unfortunately, horizontally layered SISCAP phase adjusters do not provide the same flexibility in waveguide design as lateral SICAP devices, and therefore not provide as good a mode confinement and resulting phase shift performance An object of the present invention is to overcome the shortcomings of the prior art by providing a laterally disposed MOSCAP phase adjuster, and a method of fabricating a MOSCAP phase adjuster.

SUMMARY OF THE INVENTION

Accordingly, the present invention relates to a phase adjuster device comprising:

a substrate;

a first conductive region on the substrate including a first n or p dopant material at a first doping level;

a first contact region on the substrate, adjacent to the first conductive region, including the first dopant material at a second, higher, doping level;

a second conductive region including a second n or p dopant material, opposite the first dopant material, at a second doping level;

a second contact region on the substrate, adjacent to the first conductive region, including the second dopant material at a second, higher, doping level; and an insulator layer extending perpendicularly from the substrate between the first conductive region and the second conductive region;

wherein the second conductive region includes a raised spacer portion extending upwardly beyond the first conductive region and at least partially across the top of the first conductive region.

Another aspect of the present invention relates to a method of fabricating a phase adjuster device comprising;

providing a substrate with a device layer, comprising a first material thereon;

etching the device layer to form a first conductive region, a first contact region, and an opening on the substrate;

forming an insulator layer on a vertical side of the first conductive region;

depositing a second material, different than the first material, in the opening;

etching the second material to form a second conductive region and a second contact region;

doping the first conductive region with a first doping material at a first doping concentration;

doping the first contact region with the first doping material at a second doping concentration, higher than the first doping concentration;

doping the second conductive region with a second doping material at a third doping concentration; and doping the second contact region with the second doping material at a fourth doping concentration, higher than the third doping concentration;

wherein the step of depositing the second material in the opening also comprises depositing the second material over the first conductive region forming a rounded transition section on top of the second conductive region; and wherein etching the second material comprises etching the rounded transition section to form a raised spacer portion extending from the first conductive region adjacent the insulator layer.

BRIEF DESCRIPTION OF THE DRAWINGS

The invention will be described in greater detail with reference to the accompanying drawings which represent preferred embodiments thereof, wherein:

FIG. 1 is a cross-sectional view of a phase adjuster in accordance with an embodiment of the present invention;

FIGS. 4A to 4E are side views representing an alternative embodiment for the final deposition, masking and etching steps of the method of FIGS. 2A to 2F.

DETAILED DESCRIPTION

Figure 2A:
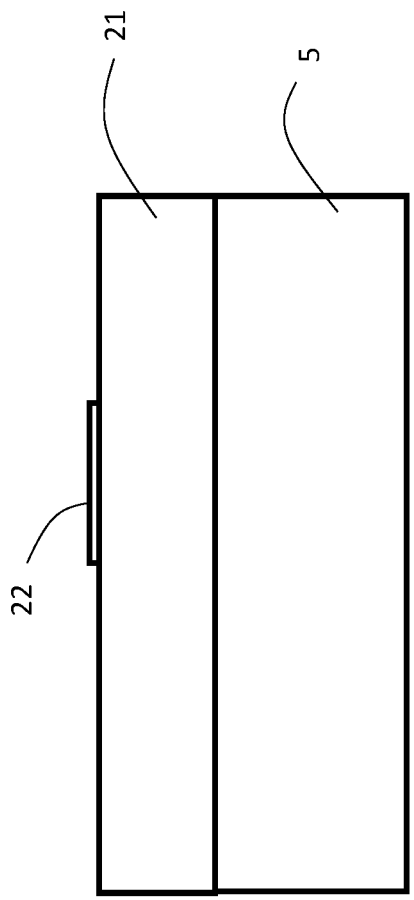
FIGS. 2A to 2F are side views representing fabrication steps for a method of fabricating the device of FIG. 1.

While the present teachings are described in conjunction with various embodiments and examples, it is not intended that the present teachings be limited to such embodiments. On the contrary, the present teachings encompass various alternatives and equivalents, as will be appreciated by those of skill in the art.

A MOSCAP phase adjuster 1 in accordance with the present invention includes a first conductive region 2, e.g. body, a second conductive region 3, e.g. gate, and a insulator region 4 therebetween, all mounted on a substrate 5. The first and second conductive regions 2 and 3 may form a ridge waveguide structure. The substrate 5 may be comprised of a dielectric material, such as an oxide of a semiconductor, and may be comprised of a silicon dioxide layer of a silicon on insulator (SOI) structure, as is well known in the industry.

The first conductive region may be comprised of a semiconductor material, e.g. silicon, doped with n+ material, e.g. phosphorous, arsenic, antimony, bismuth and lithium. Typically, the first conductive region 2 is about 200 nm to 250 nm high, but any suitable height is possible. Adjacent to the first conductive region 2 is a first contact region 6, which is thinner than the first conductive region 2, e.g. about half as thick or 100 nm to 125 nm thick. The first contact region 6 may form a second slab waveguide region. The first contact region 6 may comprise the same semiconductor material as the first conductive region 2, and may include a higher concentration of n++ doping material providing greater electrical conductivity. The first contact region 6 may include a gradually increasing doping concentration from the first conductive region 2 to the outer end of the first contact region 3. The first contact region 6 may be capable of receiving metal contacts (not shown) for transmitting electrical control, e.g. modulation, signals.

The second conductive region 3, may be comprised of a semiconductor, a metal, or metal like material, e.g. polysilicon, doped with p+ material, e.g. boron, aluminum, gallium and indium. Typically, the second conductive region 3 is about 200 nm to 250 nm high, but any suitable height is possible. The second conductive region 3 may include a raised spacer portion 7. The raised spacer portion 7 may extend upwardly from the second conductive region 3 beyond the first conductive region 2, and may include an arm, which extends at least partially across the first conductive region 2 with the insulator region 4 therebetween, as hereinbelow discussed with reference to FIGS. 4A to 4E. Adjacent to the second conductive region 6 is a second contact region 8, which is thinner than the second conductive region 3, e.g. about half as thick or 100 nm to 125 nm thick. The second contact region 8 may form a second slab waveguide region. The second contact region 8 may comprise the same material as the second conductive region 3, and may include a higher concentration of p++ doping material providing greater electrical conductivity. The second contact region 8 may include a gradually increasing doping concentration from the second conductive region 3 to the outer end of the second contact region 8. The second contact region 8 may be capable of receiving metal contacts (not shown) for transmitting electrical control, e.g. modulation, signals.

The insulator region or gate dielectric layer 4 extends perpendicular to the substrate 5 in between the first and second conductive regions 2 and 3. The insulator region 4 may be comprised of a dielectric material, which may be the same as the substrate 5 or a different dielectric material. The insulator region 4 may be from 5 nm to 20 nm wide, and preferably about 10 nm wide. Example dielectric materials include one or a combination of silicon dioxide, silicon nitride, and hafnium oxide, ideally having high dielectric constants providing a fast charging and discharging of the free carriers.

Figure 4C:
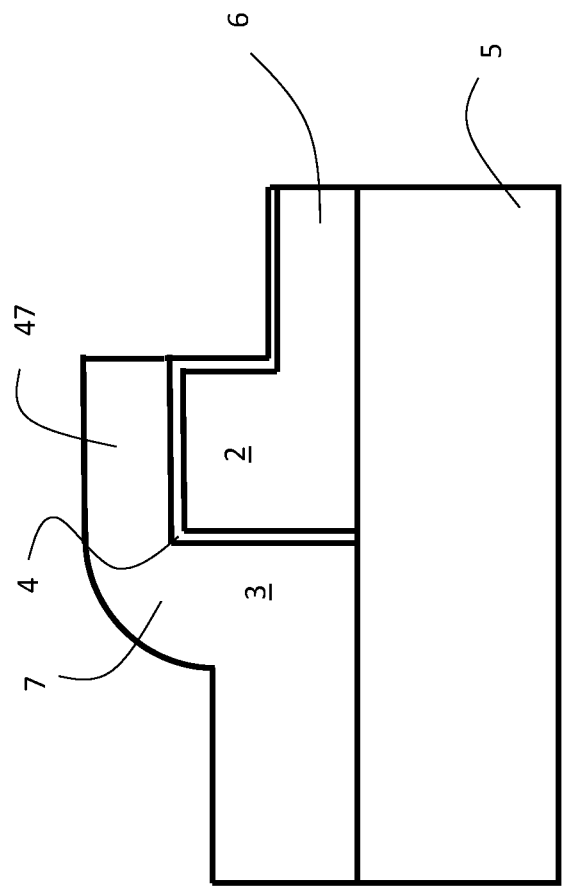
Figure 4D:
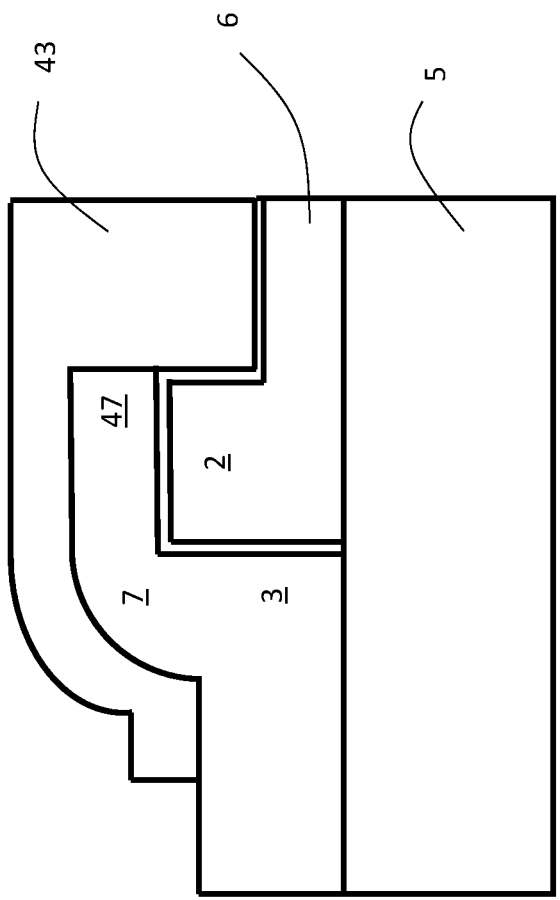
Figure 4E:
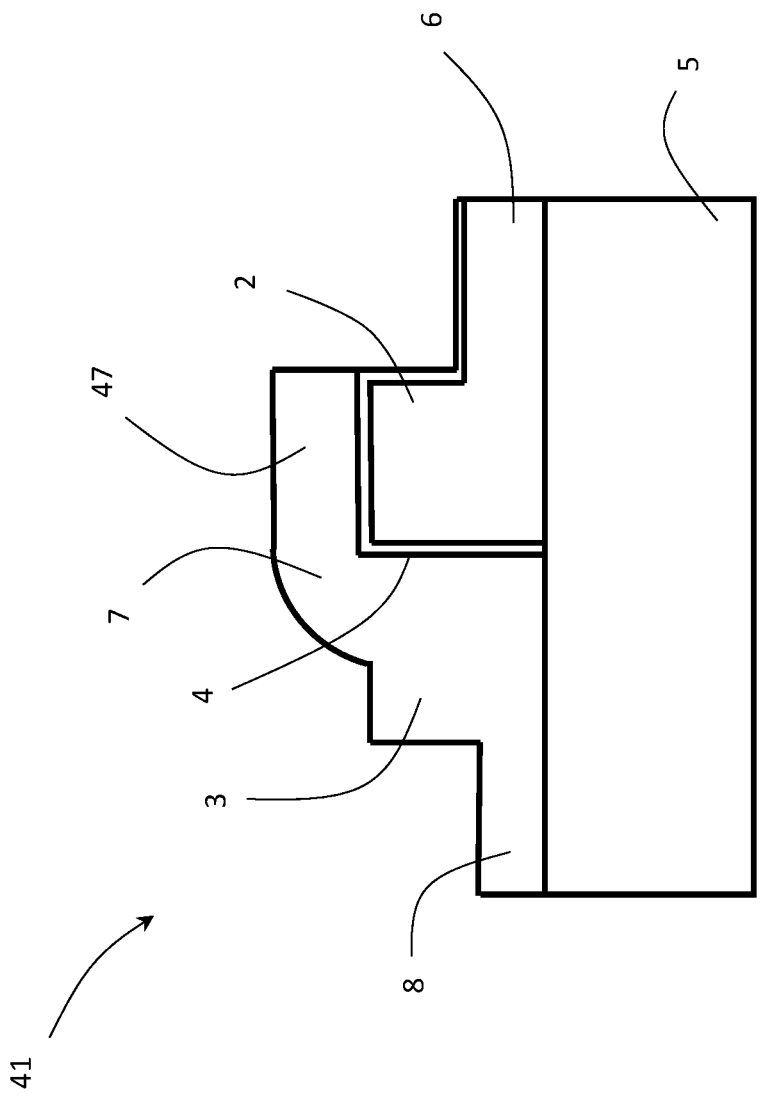

In an alternate embodiment illustrated in FIG. 4E, the raised spacer portion 7 may be extended over top of the first conductive region 2 forming an arm 47 of the second conductive region 3. Ideally, the arm 47, may extend across the top of the second conductive region 3 forming an L-shaped second conductive region 3. Furthermore, the insulator region 4 may also extend across the top of the first conductive region 2 between the first and second conductive regions 2 and 3. The extended L-shaped second conductive region 3/47 increases optical mode overlap compared to either horizontal or lateral MOSCAP phase adjusters.

Figure 2B:
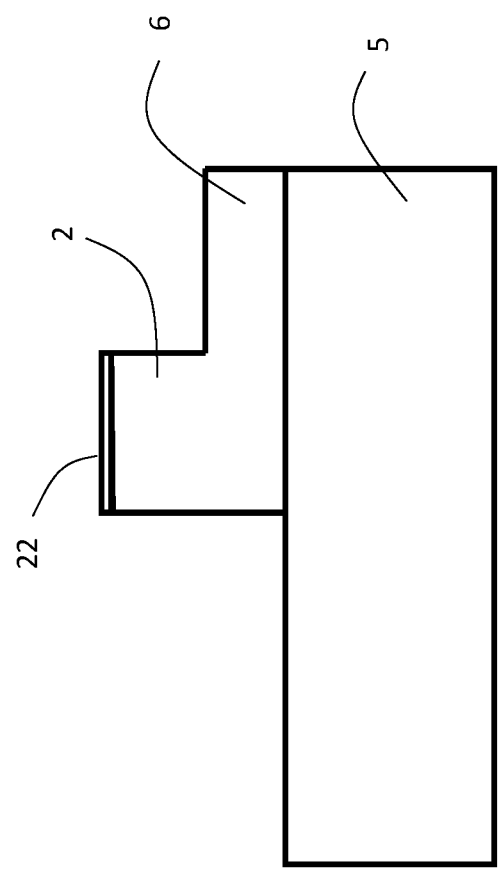

In an example fabrication method, illustrated in FIGS. 2A to 2F, the initial step, illustrated in FIG. 2A, includes providing a substrate 5, which may be comprised of a dielectric material, e.g. silicon dioxide, with a waveguide device layer 21, e.g. a semiconductor material, such as silicon, thereon. The device layer 21 may be the thickness of the first conductive region 2 or larger. If the device layer 21 is larger than the first conductive region 2, then an initial etch or polishing step is required. Ideally, the substrate 5 and device layer 21 comprise a SOI wafer, as is well known in the art. A hard mask 22, e.g. silicon nitride, may be positioned over a portion of the semiconductor layer 21 to define the first conductive region 2. FIG. 2B illustrates a multi-step etching process, in which one section of the layer 21 is partially etched, e.g. about half the height or about 100 nm to 125 nm, to form the first contact region 6, and another section of the device layer 21, on the opposite side of the first conductive region 2 is fully etched down to the substrate 5 to form the first conductive region 2, and to provide an opening on the substrate 5 to make room for the second conductive region 3.

Figure 2C:
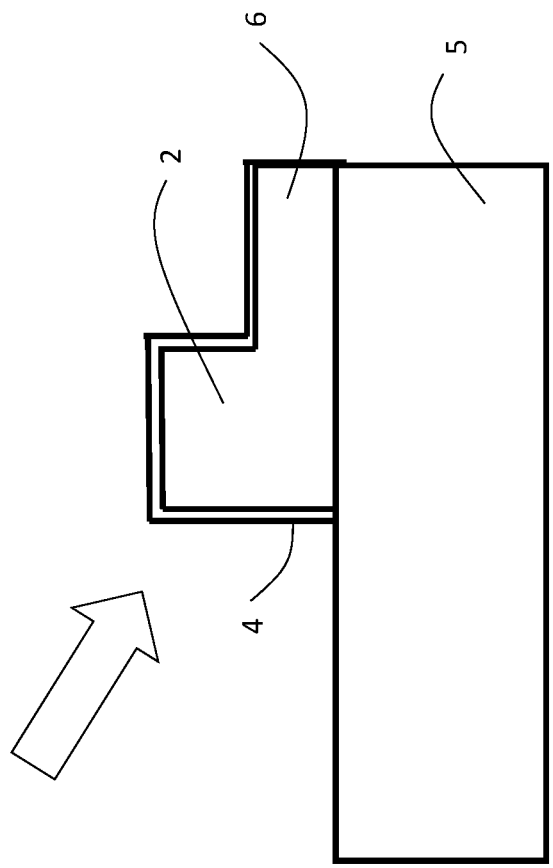

If some or all of the hard mask 22 remains, a hard mask removal step may be conducted before the remaining structure, i.e. the first conductive region 2 and the first contact region 6, is then subject to an oxidation step, FIG. 2C, to form the insulator region 4 on the side of the first conductive region 2. A pad oxide layer may be applied to those areas of the first conductive region 2, e.g. top, and opposite side, and the first contact region 6, e.g. top and opposite side, to prevent oxide from developing thereon. Alternatively, the superfluous oxide may be removed, e.g. polished, after the oxidation step.

Figure 2D:
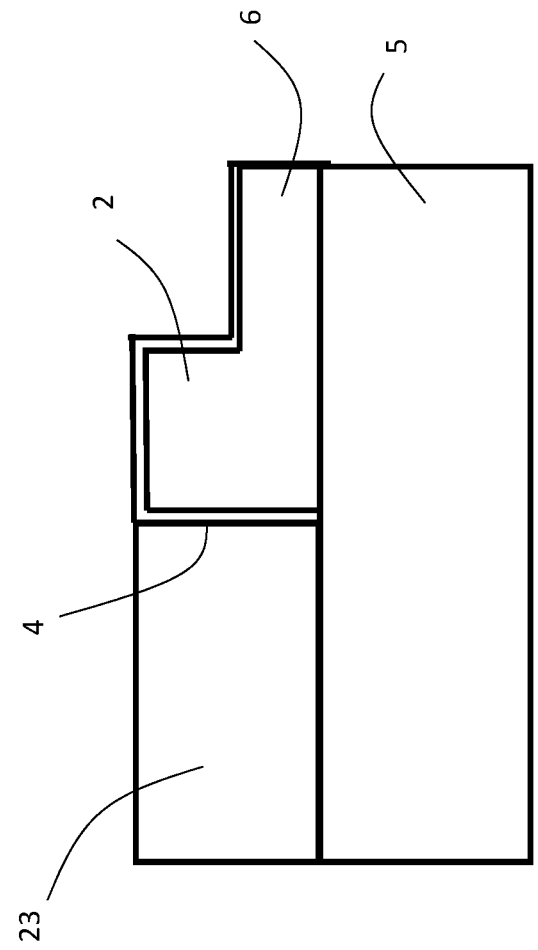
Figure 2E:
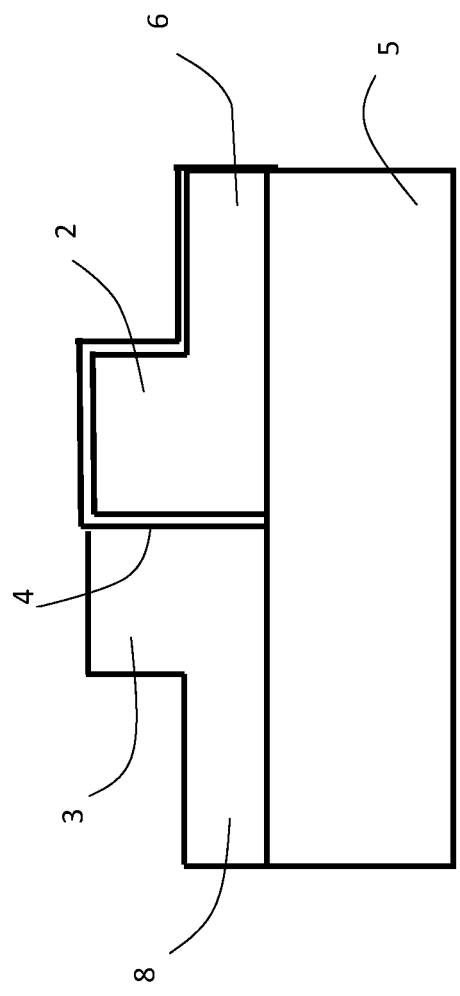
Figure 2F:
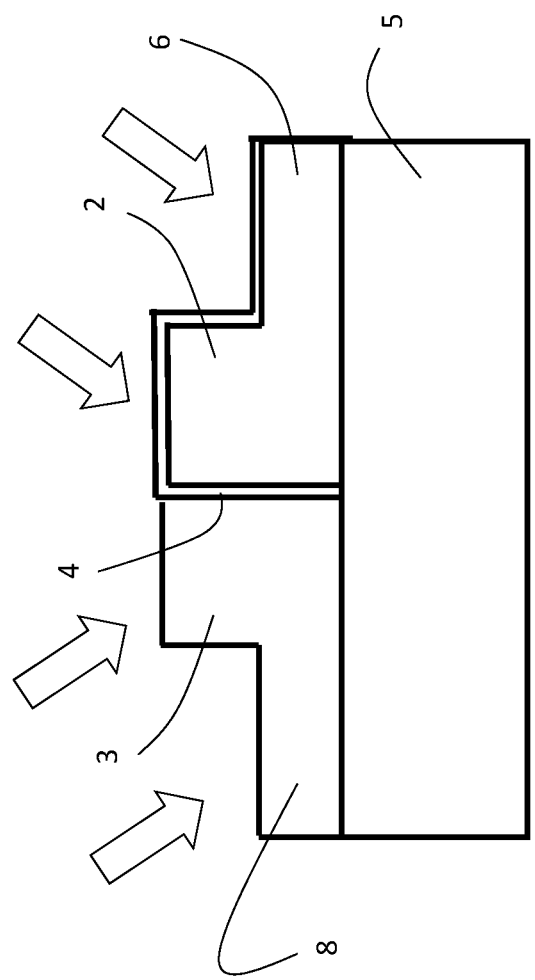

FIG. 2D illustrates a deposition step for a second semiconductor, metal or metal-like material 23, e.g. poly-silicon, on the substrate 5 and adjacent to the insulator region 4. The material 23 may then be subject to a masking step to define the second conductive region 3 and the second contact region 8, and then an etching step to form the second conductive region 3 and the second contact region 8. (FIG. 2E). Finally, as illustrated in FIG. 2F, the various elements, i.e. the first conductive region 2, the second conductive region 3, the first contact region 6 and the second contact region 8 are subject to doping to diffuse the desired amounts of dopants, as hereinbefore discussed.

Figure 3A:
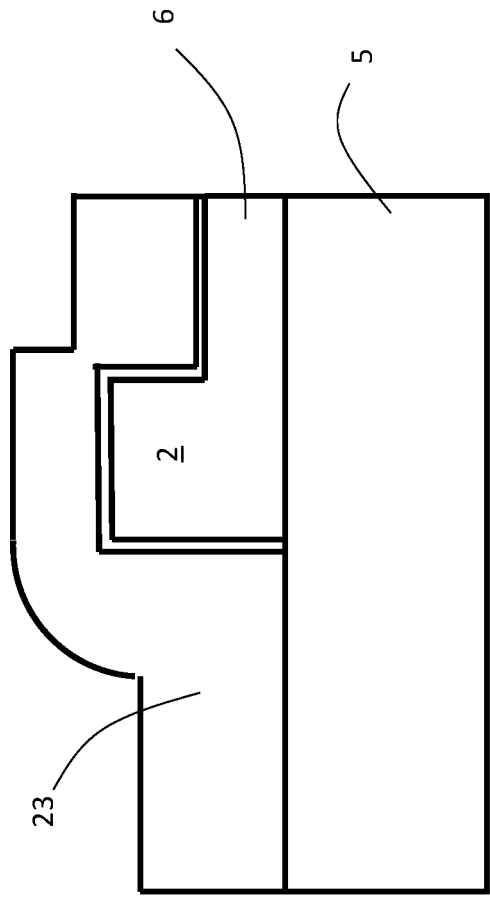
FIGS. 3A to 3E are side views representing a preferred embodiment for the final deposition, masking and etching steps of the method of FIGS. 2A to 2F.
Figure 3B:
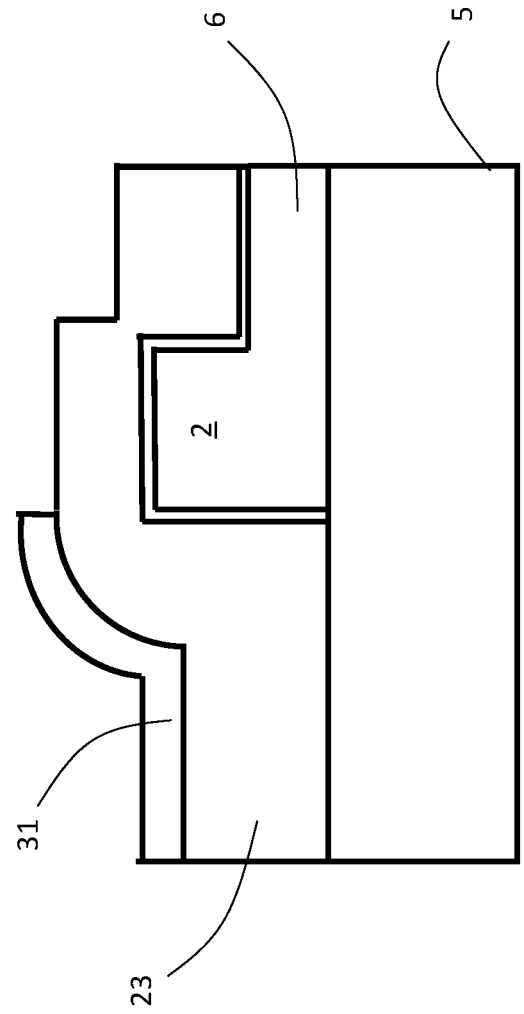

FIGS. 3A to 3E illustrate a preferred embodiment for the deposition, masking and etching steps for the second conductive region 3 and the second contact region 8, as hereinbefore illustrated with reference to FIGS. 2D and 2E. In the deposition step, FIG. 3A, the material 23 is deposited over the entire remaining structure, i.e. the opening on the substrate 5, the first conductive region 2, and the first contact region 6. The deposition step forms a rounded transition section in the material 23, which will become the raised spacer portion 7, overtop of the second conductive region 2 as the material 23 transitions between the covering the opening on the substrate 5 to the top of the first conductive region 2. With reference to FIG. 3B, a hard mask 31 is placed over a portion of the material 23, including over the second contact region 8 and the second conductive region 3, including the raised spacer portion 7.

Figure 3C:
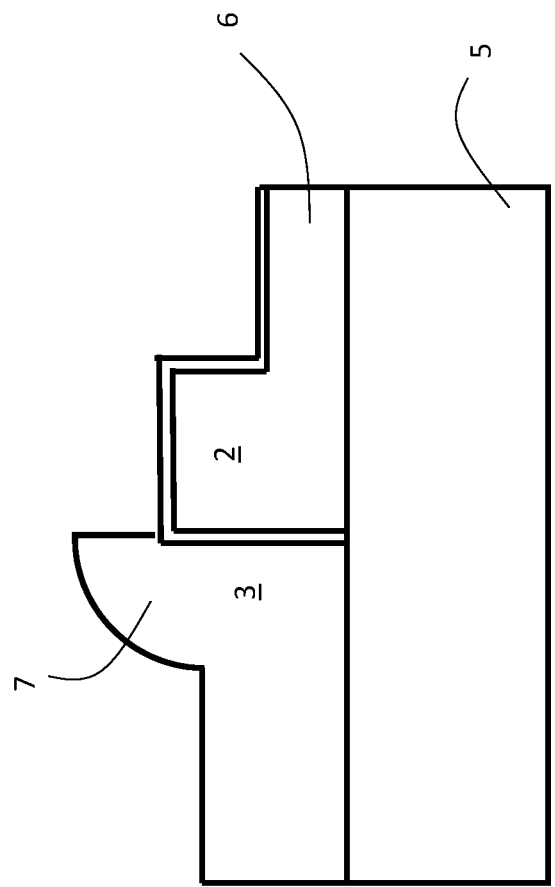
Figure 3D:
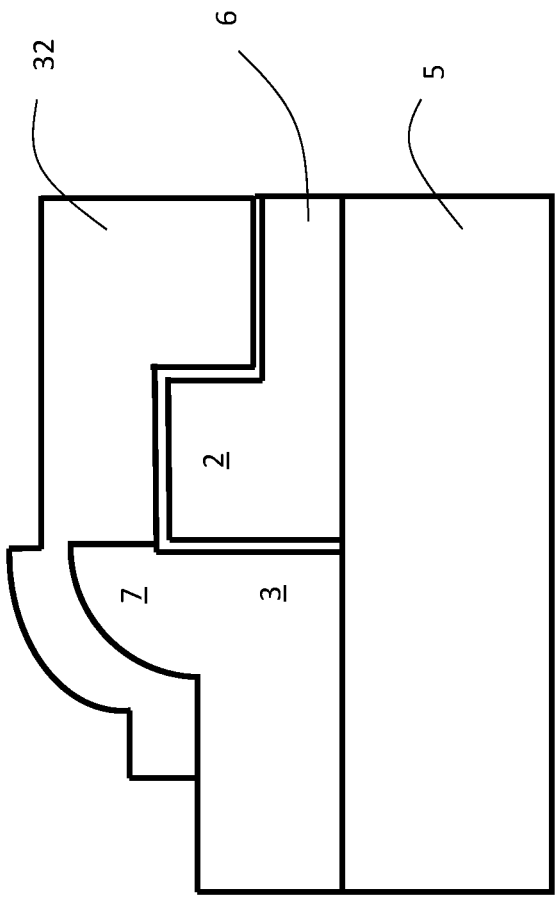
Figure 3E:
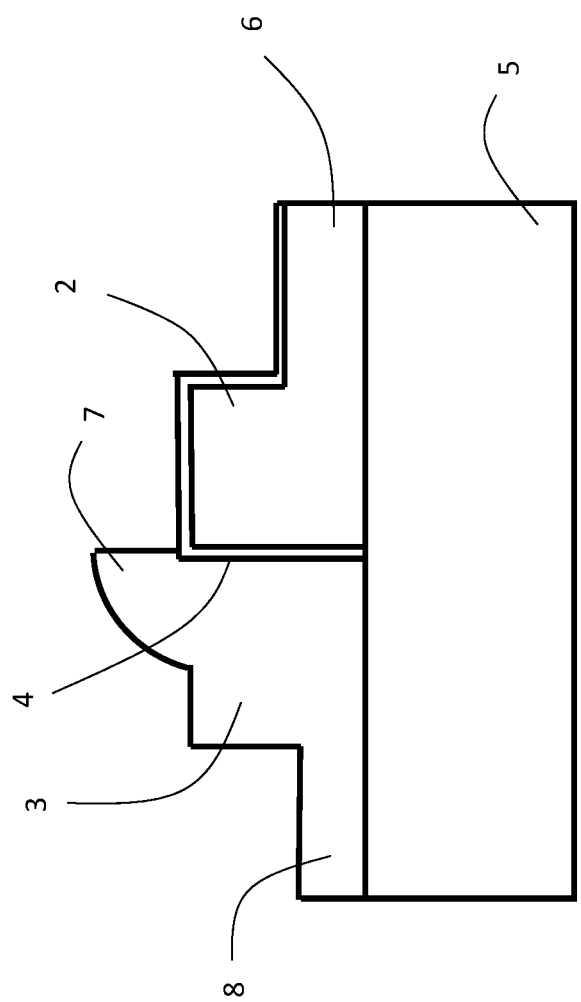

With reference to FIG. 3C, a first etching step is conducted to remove all of the material 23 over the first conductive region 2 and the first contact region 6. Then a mask 32 is deposited over the first conductive region 2, the first contact region 6, and the second conductive region 3, including the raised spacer portion 7 to define the second contact region 8. A second etching step (FIG. 3E) is provided to form the second contact region 8. Any remnants of the mask 32 may then be removed by any suitable means to form the finished phase adjuster device 1.

FIGS. 4A to 4E illustrate an alternative embodiment for the deposition, masking and etching steps for the second conductive region 3 and the second contact region 8, as hereinbefore illustrated with reference to FIGS. 2D and 2E for a phase adjuster 41. In the deposition step, FIG. 4A, the material 23 is deposited over the entire remaining structure, i.e. the opening on the substrate 5, the first conductive region 2, and the first contact region 6. The deposition step forms a rounded transition section in the material 23, which will become the raised spacer portion 7, and an arm 47 extending overtop of, e.g. at least ½ way across, preferably at least ¾ the way across, and ideally completely across the second conductive region 2 as the material 23 transitions between covering the opening on the substrate 5 to the top of the first conductive region 2. With reference to FIG. 4B, a first hard mask 42 is placed over a portion of the material 23, including over the first contact region 2, the second contact region 8 and the second conductive region 3, including the raised spacer portion 7, only leaving the material 23 over the first contact region 6 exposed.

With reference to FIG. 4C, a first etching step is conducted to remove all of the material 23 over the first contact region 6, and form an L-shaped second conductive region 3, including the raised spacer portion 7 and the arm 47 over the first conductive region 2 with the insulating layer 4 therebetween. Then a second mask 43 is deposited over the first conductive region 2, the first contact region 6, and the second conductive region 3, including the raised spacer portion 7 and arm 47 to define the second contact region 8. A second etching step (FIG. 4E) is provided to form the second contact region 8. Any remnants of the mask 42 may then be removed by any suitable means to form the finished phase adjuster device 41. The L-shaped second conductive region 3/47 increases optical mode overlap for either a horizontal or a lateral MOSCAP phase adjuster.

For the phase adjuster device 41, the doping steps for the first conductive region 2 and the first contact region 6 may be executed prior to the material 23 being deposited.

The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A phase adjuster device comprising:
a substrate;
a first conductive region on the substrate including a first n or p dopant material at a first doping level;
a first contact region on the substrate, adjacent to the first conductive region, including the first dopant material at a second, higher, doping level;
a second conductive region including a second n or p dopant material, opposite the first dopant material, at a second doping level;
a second contact region on the substrate, adjacent to the first conductive region, including the second dopant material at a second, higher, doping level; and
an insulator layer extending perpendicularly from the substrate between the first conductive region and the second conductive region;
wherein the second conductive region includes a raised spacer portion extending upwardly beyond the first conductive region and at least partially across the top of the first conductive region, wherein the second conductive region also extends completely across the top of the first conductive region.

2. The device according to claim 1, wherein the insulating layer also extends across the top of the first conductive region between the first and second conductive regions.

3. The device according to claim 1, wherein the insulating layer comprises an oxidized layer of the first conductive region.

4. The device according to claim 3, wherein the insulator layer comprises a dielectric.

5. The device according to claim 4, wherein the insulator layer comprises a same material as the substrate.

6. The device according to claim 5, wherein the insulator layer comprises silicon dioxide.

7. The device according to claim 1, wherein the second conductive region comprises a metal or metal-like material.

8. The device according to claim 7, wherein the second conductive region comprises doped poly-silicon.

9. The device according to claim 8, wherein the first conductive region comprises doped silicon.

* * * * *